(12) United States Patent
Wellons et al.

(10) Patent No.: US 11,594,340 B2
(45) Date of Patent: Feb. 28, 2023

(54) MANUFACTURE OF PARTICULATE REFERENCE MATERIALS

(71) Applicant: SAVANNAH RIVER NUCLEAR SOLUTIONS, LLC, Aiken, SC (US)

(72) Inventors: Matthew S. Wellons, Aiken, SC (US); Michael A. Devore, II, North Augusta, SC (US); Wendy W. Kuhne, Evans, GA (US)

(73) Assignee: Battelle Savannah River Alliance, LLC, Aiken, SC (US)

( * ) Notice: Subject to any disclaimer, the term of this patent is extended or adjusted under 35 U.S.C. 154(b) by 268 days.

(21) Appl. No.: 15/930,639

(22) Filed: May 13, 2020

(65) Prior Publication Data

US 2021/0358646 A1    Nov. 18, 2021

(51) Int. Cl.

| B05D 1/06 | (2006.01) |
|---|---|
| C23C 14/46 | (2006.01) |
| G21C 3/60 | (2006.01) |
| G21C 3/62 | (2006.01) |
| C22B 60/02 | (2006.01) |
| B22F 9/02 | (2006.01) |
| C23C 24/00 | (2006.01) |

(52) U.S. Cl.
CPC ............. *G21C 3/60* (2013.01); *B05D 1/06* (2013.01); *B22F 9/026* (2013.01); *C22B 60/0217* (2013.01); *C23C 14/46* (2013.01); *C23C 24/00* (2013.01); *G21C 3/623* (2013.01); *B22F 2202/06* (2013.01); *B22F 2301/45* (2013.01); *Y10T 428/12056* (2015.01); *Y10T 428/12063* (2015.01)

(58) Field of Classification Search
CPC .......... G21C 3/60; G21C 3/623; G21C 17/00; B05D 1/06; B05D 1/04; B05D 1/02; B22F 9/026; B22F 2202/06; B22F 2301/45; C22B 60/0217; Y10T 428/12056; Y10T 428/12063; Y02E 30/30
See application file for complete search history.

(56) References Cited

U.S. PATENT DOCUMENTS

| 6,039,894 A | 3/2000 | Sanjurjo et al. |
| 6,126,901 A * | 10/2000 | Patch .................. G01T 3/00 |
| | | 422/71 |
| 7,708,949 B2 | 5/2010 | Stone et al. |
| 7,882,799 B2 | 2/2011 | Dick et al. |
| 9,895,707 B2 | 2/2018 | Duan et al. |

(Continued)

OTHER PUBLICATIONS

Cheng, et al. "Aerosol Sampler Calibration" *Am. Conf. Gov. Indust. Hyg.* (2008) pp. 1-26.

(Continued)

*Primary Examiner* — Alexander M Weddle
(74) *Attorney, Agent, or Firm* — Dority & Manning, P.A.

(57) ABSTRACT

Methods for forming particulates that are highly consistent with regard to shape, size, and content are described. Particulates are suitable for use as reference materials. Methods can incorporate actinides and/or lanthanides, e.g., uranium, and can be used for forming certified reference materials for use in the nuclear industry. Methods include formation of an aerosol from an oxalate salt solution, in-line diagnostics, and collection of particles of the aerosol either in a liquid impinger or on a solid surface.

18 Claims, 12 Drawing Sheets

(56) References Cited

U.S. PATENT DOCUMENTS

2007/0212542 A1 9/2007 Guo et al.
2012/0264646 A1 10/2012 Link et al.

OTHER PUBLICATIONS

Dixkens, et al. "Development of an Electrostatic Precipitator for Off-Line Particle Analysis" *Aeros. Sci. Tech.* 30 (1999) pp. 438-453.
Duan, et al. "Flow-Focusing Monodisperse Aerosol Generator for Calibration of Spray Diagnostics Instruments" *Int'l. Symp. Laser Imag. Tech.* (2016) pp. 1-11.
Duan, et al. "A New Monodisperse Droplet Generator and its Applications" *ILASS* (2016) pp. 1-5.
Duan, et al. "Generation of monodisperse aerosols by combining aerodynamic flow-focusing and mechanical perturbation" *Aeros. Sci. Tech.* 50 (2015) pp. 17-25.
Hong, et al. "Gentle Sampling of Submicrometer Airborne Virus Particles using a Personal Electrostatic Particle Concentrator" *Environ. Sci. Tech.* 50 (2016) pp. 12365-12372.
Jaworek, et al. "Electrospray application to powder production and surface coating" *J. Aeros. Sci.* (2018) pp. 57-92.
Knott, et al. "Production and Characterization of Monodisperse Reference Particles" *IAEA Symp.* (2014) pp. 1-7.
Licina, et al. "Development of a high flow aerosol sampling device" *Lund U.* (2017) pp. 1-108.
Middendorp, et al. "Micro Particle Suspensions for Preparation of Reference Materials for Particle Analysis Methods in Safeguards" *Esarda Bull.* 54 (2017) pp. 23-30.
MSP Corporation. "Model 1520—Flow-Focusing Monodisperse Aerosol Generator™ (FMAG™)" *TSI® Inc.* (2013) pp. 1-2.
Zheng, et al. "Liquid impinger BioSampler's performance for size-resolved viable bioaerosol particles" *J. Aeros. Sci.* 106 (2017) pp. 34-42.

* cited by examiner

MANUFACTURE OF PARTICULATE REFERENCE MATERIALS

FEDERAL RESEARCH STATEMENT

This invention was made with Government support under Contract No. DE-AC09-08SR2470, awarded by the United States Department of Energy. The Government has certain rights in the invention.

BACKGROUND

Monodisperse particles with known isotopics and uniform particle size, shape, and content are extensively used in a variety of applications, including instrument calibration, filter testing, particle deposition studies, health effect studies, and other fundamental research applications. For instance, Certified Reference Material (CRM) particulates are an integral part of quality assurance and quality control of analytical measurements. The quality control of analytical methodologies, including instrument and method validation, as well as the assurance of the quality of reported results, requires the use of precise and accurately characterized reference materials.

CRMs play a particularly important role in providing adequate nuclear safeguards. Individual particle analysis of nuclear materials is an important tool in nuclear safeguards and nuclear forensics. The application of safeguards measures by the International Atomic Energy Agency (IAEA) involves analytical measurements of samples of particles in the sub-micrometer to micrometer range taken during inspection of nuclear facilities. Different techniques are utilized for particle discrimination and characterization, including scanning electron microscopy coupled with energy dispersive X-ray spectroscopy (SEM/EDX), mass spectrometric methods such as laser ablation-multi-collector-inductively coupled plasma-mass spectrometry (LA-MC-ICP-MS), large geometry secondary ionization mass spectrometry (LG-SIMS), and thermal ionization mass spectrometry (TIMS). Constant development and advancement of such analytical techniques is required to improve safeguards measures and a key to such development and advancement is the availability of suitable CRM to assure accuracy of the techniques.

Unfortunately, the availability of reference materials with precisely defined characteristics, such as the number of uranium and/or plutonium atoms per particle, size, density, chemical form, and elemental and isotopic composition, is very limited. Available reference materials include metallic specimens, $UF_6$ gaseous samples, oxide powders, or uranium and/or plutonium containing solutions with different isotopic compositions. Such materials are often lacking in consistency with regard to the amount of fissile material per particle, as well as with regard to shape, size distribution, morphology, and microcrystallinity of the materials.

In an attempt to address such issues, and for quality control purposes, the IAEA has implemented a dedicated initiative to enhance current analytical capabilities by encouraging the development and production of tailor-made reference materials for the analysis of uranium isotope signatures in single particles. In addition to uranium-only-containing particles, the IAEA requires mixed-elemental composition particulate materials with specific isotopic compositions.

What are needed are state of the art methods for production of particulates exhibiting high consistency with regard to shape, size, and content. More specifically, what are needed are methods for production of particulates suitable for use as certified reference materials and in particular, for use as certified reference materials in the nuclear industry.

SUMMARY

According to one embodiment, disclosed is a method for forming a monodisperse particulate. A method can include forming a solution that includes an oxalate salt of an actinide and/or a lanthanide (e.g., uranium or a mixed uranium composition). A method can also include forming an aerosol of the solution, the aerosol including particles of the actinide and/or the lanthanide. Optionally, a method can also include in-line diagnostics, e.g., sizing of the particulate as it is formed. A method can also include impinging the aerosol into a liquid collection media to thereby collect a particulate of the aerosol. The liquid collection media can have a viscosity of about 0.9 centipoise (cP) or greater at 20° C. and can have a vapor pressure of about 200 Pascal (Pa) or less at 20° C. The particulate can be a highly uniform monodisperse particulate. For instance, the particulate can have an average particle size of about 10 micrometers ($\mu m$) or less and a geometric standard deviation of about 1.25 or less; for instance, from about 1.05 to about 1.25. In addition, the method can produce a large amount of the particulate over a relatively short time period; for instance, at a rate of about 0.01 milligrams per hour or even greater in some embodiments. As such, disclosed methods can provide a route for the formation of milligram quantities of highly consistent particulates in a matter of hours.

According to another embodiment, disclosed is a method for forming a composite structure that includes a substrate and a monodisperse particulate deposited on a surface of the substrate. A method can include forming a solution that includes an oxalate salt of a metallic element and forming an aerosol of the solution, the aerosol including particles that include the metallic element. Optionally, a method can also include in-line diagnostics, e.g., sizing of the particulate as it is formed. A method can also include passing the aerosol through an electric field so as to ionize particles of the aerosol. Following, the method can include directing the aerosol past a conductive surface of a substrate, and thereby depositing ionized particles of the aerosol on the conductive surface. The deposited particulate can be a highly uniform monodisperse particulate. For instance, the particulate can have an average particle size of about 10 $\mu m$ or less and a geometric standard deviation of about 1.25 or less, for instance from about 1.05 to about 1.25.

Also disclosed is a microanalytical test specimen that includes a substrate comprising a conductive material on a surface and a particulate deposited on the surface. The particulate can be a highly uniform monodisperse particulate. For instance, the particulate can have an average particle size of about 10 $\mu m$ or less and a geometric standard deviation of about 1.25 or less; for instance, from about 1.05 to about 1.25. In one embodiment, the test specimen can include the monodisperse particulate in a predesigned pattern on the surface and/or can include fiducial markings on the surface.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Figure 1:
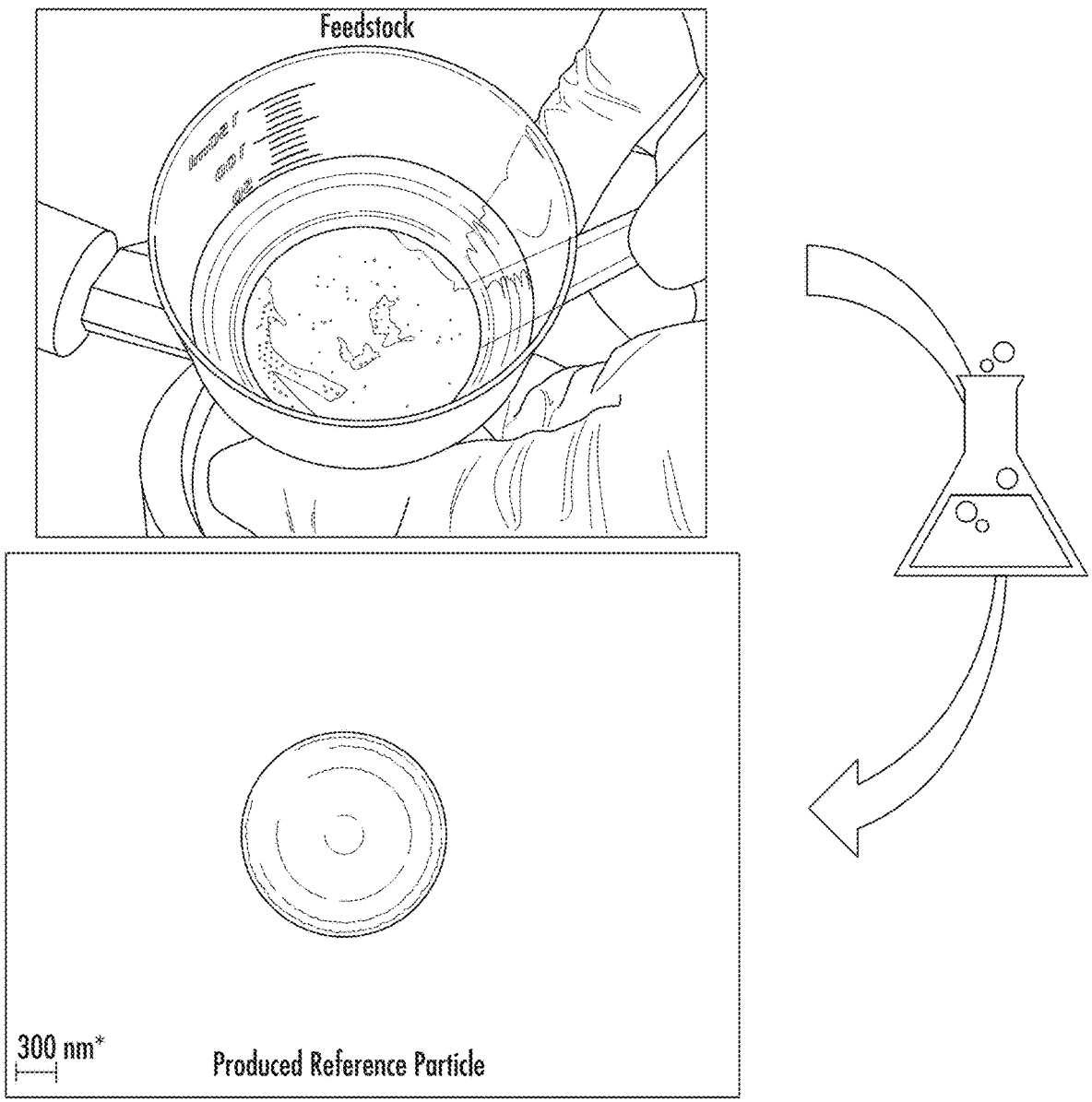
FIG. 1 presents a pictogram of a reference material production process.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

Disclosed are methods for forming particulates and materials that can be formed according to the methods. Beneficially, particulates formed according to the methods can be highly consistent with regard to shape, size, and content, and as such, can be suitable for use as reference materials.

In general, the particles can include one or more metallic elements of interest, with the remainder of the particle generally comprised primarily of carbon and oxygen. In particular embodiments, the methods can be utilized to form particulates containing actinides and/or lanthanides, and as such, can be suitable for use as CRM in the nuclear industry. For instance, the methods can be used to form particulates that include a single metallic element of interest, e.g., uranium, as the only metallic element contained in the particles at a known isotope and concentration content. In other embodiments, composite particles can be formed that can include multiple elements of interest, e.g., a combination of uranium and plutonium, uranium and cesium, uranium and thorium, etc. so as to provide a tailored particulate with highly consistent content, shape, and size. However, disclosed formation methods are not intended to be limited to only particulates including one or more lanthanide or actinide elements, and in other embodiments, disclosed methods can be utilized in forming a particulate including any element(s) of interest.

In addition to the ability to provide a particulate with highly consistent content and morphology, disclosed methods can form a particulate relatively quickly. For instance, disclosed methods can provide for the formation of a suspension of a particulate suitable for uses as a CRM at milligram quantities in a matter of hours. By way of example, a method can form a suspension of particles at a rate of about 0.01 mg/hour, or even faster in some embodiments. For example, a method can form about 1 milligram or more of a particulate in a period of about 100 hours or less; for instance, from about 0.5 milligram to about 2 milligrams in a period of from about 50 hours to about 100 hours.

Particles formed according to the methods can generally be formed on a micrometer scale and of a size to be useful a reference material for the application of interest. For instance, particles of a particulate can have an average diameter maxima of about 10 μm or less, about 5 μm or less, or about 1 μm or less in some embodiments. Moreover, the particulate can have a narrow size distribution; for instance, exhibiting a geometric standard deviation of about 1.5 or less, about 1.25 or less, or about 1.2 or less; for instance, from about 1.05 to about 1.25 in some embodiments.

FIG. 1 presents a high-level pictogram of a reference material production concept. Bulk feedstocks with requisite isotopic composition can be synthesized in the laboratory. According to one embodiment, disclosed is a method for conversion of a bulk feedstock into a particulate reference material as may be useful in quality control. A method can generally include an aerosol formation optionally followed by in-line diagnostics of the aerosol followed by particle collection.

Figure 2:
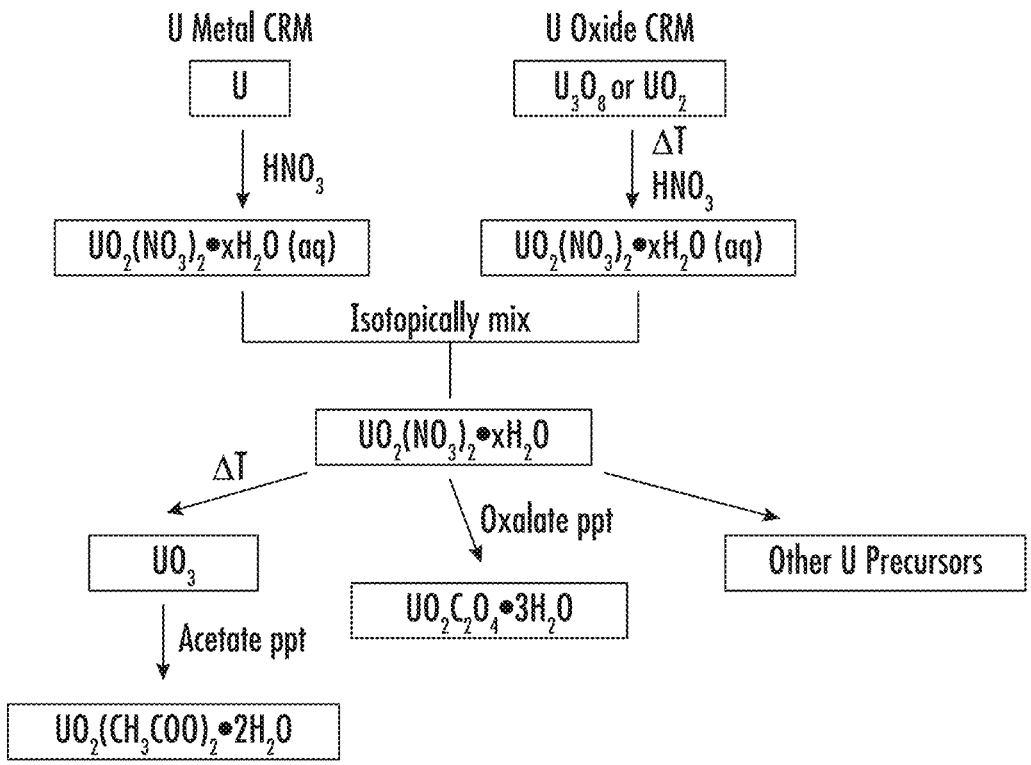
FIG. 2 presents a representative chemical reaction diagram for generation of a uranium feedstock material utilizing a combination of CRM as starting materials.

In forming an aerosol, a solution of the metallic element(s) of interest is formed. More specifically, a solution is formed of an oxalate salt of the metallic element(s) of interest. Previously, it has been common to utilize other salts such as a nitrate salt of an element (e.g., a uranium nitrate) in forming a solution for use in a particulate formation approach. However, it has surprisingly been found that through utilization of oxalate compounds, formed particulates can exhibit improved consistency. FIG. 2 presents a representative chemical reaction scheme for the generation of a uranium material through the utilization of various certified reference materials.

The solution can include the oxalate salt of the element(s) of interest in a predetermined concentration, depending upon the desired particulate product. For instance, utilization of a uranium oxalate salt having a predetermined isotopic concentration can be utilized to provide for a known isotopic concentration in the final product. Likewise, in formation of a multi-element particulate, the metallic elements of interest can be provided in the form of oxalate salts and at a predetermined mixture of starting materials so as to provide for the desired concentration ratio in the final particulate product.

The solvent used in forming a solution is not particularly limited, but in general, can include water or lower alcohols, e.g., alcohols including about 6 or fewer carbons. Depending upon the specific materials involved, it may be useful to form the solution under agitation and/or heating, so as to aid dissolution. In addition, additives can be incorporated, such as a strong acid, e.g., $HNO_3$, that can aid dissolution of the oxalate salts.

Particle production can include formation of an aerosol from the oxalate salt solution. While any aerosol formation process is encompassed herein, in some embodiments, an aerosol can be produced by use of a Vibrating Orifice Aerosol Generator (VOAG), and in one particular embodiment, by use of a Flow-Focusing Monodisperse Aerosol Generator (FMAG), which can form more consistent particle sizes and shapes.

A VOAG system is one in which a jet of liquid is formed by passing the solution through an orifice in a plate as the plate is vibrated by, e.g., a piezoelectric transducer. Even without the vibration, the jet, initially a column of the solution, would be unstable as any variations in diameter cause it to break up to form a jet of droplets. Through addition of the vibrating plate, a jet of droplets can be formed almost instantaneously, and if the amplitude and frequency of the vibration have appropriate values, the droplets are monodispersed. The size of the droplets is approximately twice the diameter of the orifice and can be calculated from the flow rate of the liquid and the vibration frequency. Depending upon the volatility of the solvent and the conditions of the aerosol formation process, the droplets can dry essentially instantaneously or over time to provide the particles.

A FMAG system may be preferred in some embodiments, as this approach for aerosol formation can provide a particulate with a lower geometric standard deviation. A FMAG system utilizes a vibration system, as is found in the VOAG system, with the further incorporation of aerodynamic flow focusing of the liquid jet, which allows for the use of a larger orifice, leading to less clogging of the system, and can provide a particulate with a narrower size distribution. FMAG systems as may be utilized in formation of an aerosol have been described, e.g., U.S. Patent Application Publication No. 2015/0324317 to Duan et al., which is incorporated herein by reference and are available in the market, e.g., from the MSP Corporation.

Following initial formation of an aerosol of the oxalate solution, the aerosol can be subjected to one or more in-line diagnostic tools to confirm desired formation parameters. A large number of aerosol characterization techniques have been developed as may be included in-line in a formation system. Examples of in-line instruments include those which infer particle size based on measurements of particle light scattering (e.g., optical particle sizers, phase Doppler particle analyzers), on measurements of particle inertia (e.g., an aerodynamic particle sizer), or on measurements of particle electric mobility (e.g., differential mobility analyzers and electrical aerosol analyzers), among others. Consequently, in situ techniques can provide detailed aerosol size distribution data (mass or number of suspended particles as a function of particle size per volume of gas).

In one embodiment, a system can incorporate an in-line aerodynamic particle sizer (APS). An APS operates through acceleration of particles through a nozzle, upon which larger particles tend to be accelerated to a lesser extent through the interrogation volume(s) than smaller particle because the larger particles can possess a greater inertia to overcome. The APS exploits this principle by accelerating particles through a nozzle to obtain size-dependent particle velocities, which can be measured by measuring the time-of-flight of the particles through the sensing zone.

In one embodiment, an in-line particle size spectrophotometer can be utilized to determine particle size of the nascent particulate. In such a system, as particles exit an APS nozzle, they cross through two laser beams separated by about 200 µm, and an elliptical mirror collects scattered light onto a photodetector. A particle passing through both beams produces two pulses of scattered light, the time delay between the pulses being related to the velocity, and hence, aerodynamic diameter of the particle. The APS can also record the height of the peaks allowing a secondary calculation of particle size based on optical scattering. Particles are only valid if exactly two peaks occur in the scattering signal in the time allotted for a particle to pass through the beams. Rejected particles can be separated into three categories: only one peak, scatter signal low when time elapsed—particle too small or missed second beam; only one peak, scatter signal high when time elapsed—particle moving too slowly (very large or recirculating); more than two peaks—coincident particles. The number of particles in each rejected category can also be counted to allow statistical corrections to be applied, if desired.

Figure 3:
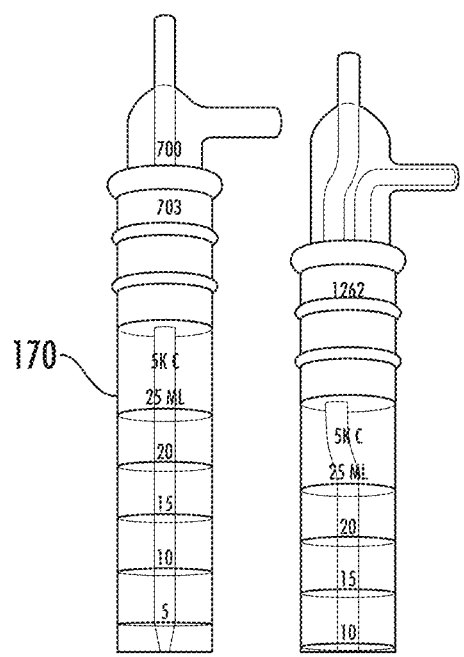
FIG. 3 illustrates a liquid to aerosol impinger particle collection device.
Figure 4:
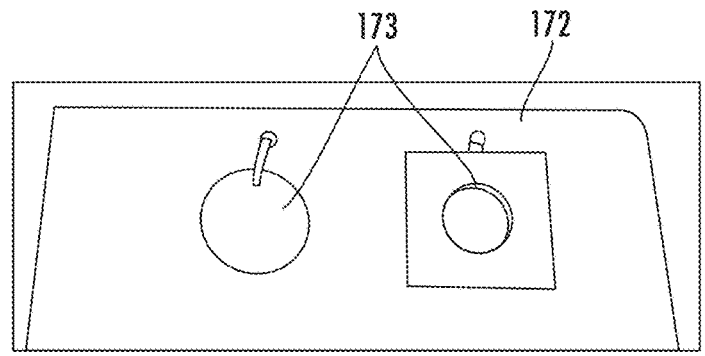
FIG. 4 illustrates an aerosol to solid particle collection device.

Following aerosol/particle formation and any in-line diagnostics, the particulate can be collected. In exemplary embodiments, disclosed methods can utilize either of two alternative collection methods. In a first approach, the particulate can be collected as a suspension in a liquid, and a liquid-to-aerosol impinger 170 can be utilized, examples of which are illustrated in FIG. 3. In another embodiment, the particulate can be collected on a surface; for instance, on a solid collector 173 carried by a holding plate 172, examples of which are illustrated in FIG. 4; for instance, in formation of a microanalytical test specimen.

When collecting the particulate in the form of a suspension, a typical liquid-to-aerosol impinger 170 can be utilized such as those illustrated in FIG. 3. However, it has been discovered that through utilization of liquid collection media exhibiting high viscosity and low vapor pressure, high concentrations of the formed particulates can be collected quickly and efficiently. More specifically, in one embodiment, a liquid collection media for a collection system can exhibit a viscosity at 20° C. of about 0.9 cP or greater and can exhibit a vapor pressure of about 200 Pa or less. In one embodiment, higher alkanes comprising 10 or more carbon atoms can be utilized as the collection media. For instance, decane can be utilized in one embodiment. An alkane collection media can be any isomer that exhibits suitable viscosity and vapor pressure. For example, n-decane can be utilized, as well as any branched isomer of the hydrocarbon, including racemates of higher alkanes and/or mixtures of different alkanes. Other examples of collection media include low viscosity mineral oils.

One embodiment of a system as may be utilized to form a particulate suspension is schematically illustrated in FIG.

Figure 5:
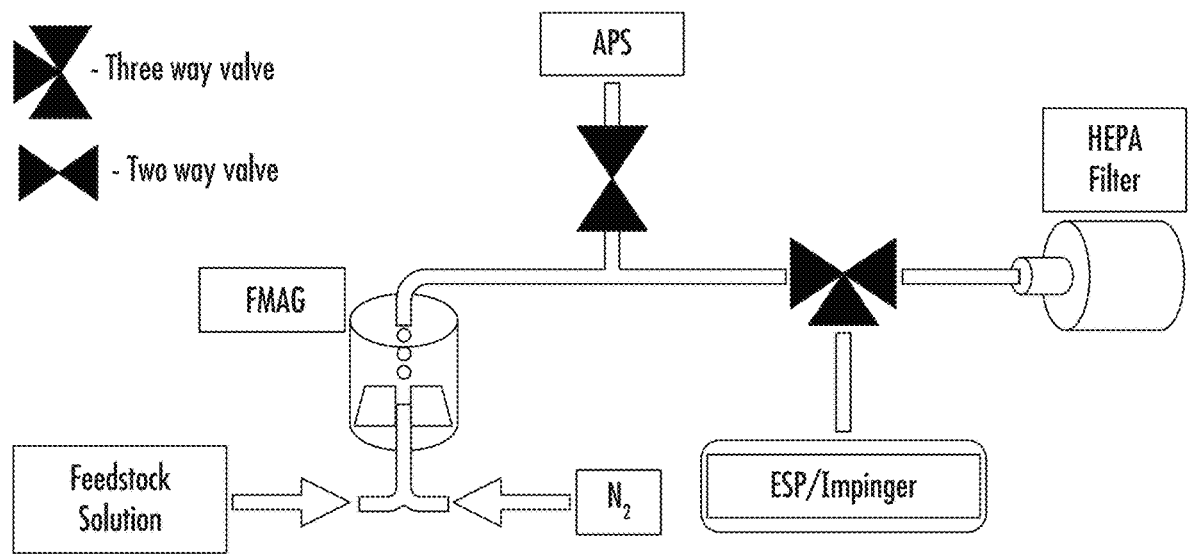
FIG. 5 schematically illustrates one embodiment of a particulate formation system.
Figure 6:
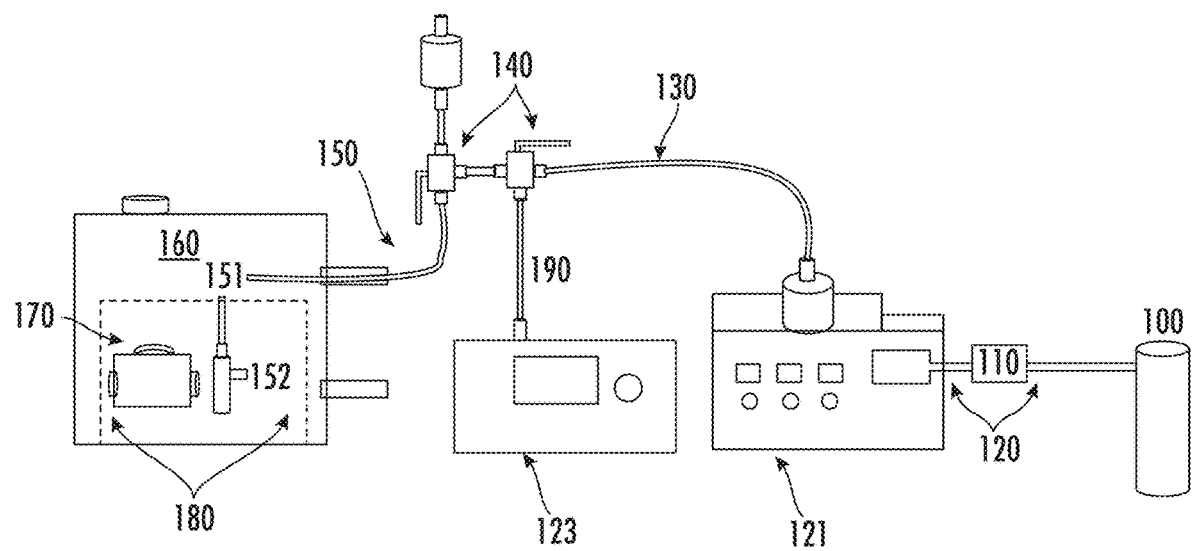
FIG. 6 schematically illustrates one embodiment of a particle formation system.

5 and FIG. 6. As shown in more detail in FIG. 6, a system can include a compressed air cylinder 100 input to a particle generator 121 via air tubing 120 fed through a regulator/air flow meter 110 (e.g., a FMAG, as illustrated in FIG. 5). A feedstock solution including a dissolved oxalate salt of the desired element(s) can be injected into the particle generator 121 according to standard aerosol formation techniques. Tubing 130 can carry the aerosol formed in the particle generator 121 to a connector 140 (e.g., a Swagelok® Valve) that can be connected to in-line diagnostics 123 (e.g., an aerodynamic particle spectrophotometer (APS), as illustrated in FIG. 5) via carbon impregnated tubing 190. In one embodiment, the particle size spectrophotometer can be utilized periodically to assess aerosol size distribution before and after dedicated production activity. In some embodiments, the particle size spectrophotometer and aerosol generator can be operated simultaneously with minor material loss to the analytical operation. An analytical operation can typically be performed periodically but can optionally pull aerosols off the main line for continuous testing.

Tubing 150, e.g., carbon impregnated tubing, can carry the aerosol to a collection unit 160 (e.g., a sealed box, rag bad, etc.) and then to a final collector 170, which in this illustrated embodiment of FIG. 5 and FIG. 6, includes a liquid-to-aerosol impinger. The tubing 150 can be connected to the collector 170 via connections 151. The collector 170 can include one or more additional connectors 152 for connection of components (e.g., an electrostatic precipitator (ESP), an impinger, or the like, as illustrated in FIG. 5) of the collector 170 to external devices (e.g., electrical connections or the like). In general, the collector 170 can be retained in a collection unit 160; for instance, a high-efficiency (HEPA) filter containment bag that can include an access 180, e.g., a zippered access, for access to the final collector 170 retained within the collection unit 160.

Figure 7:
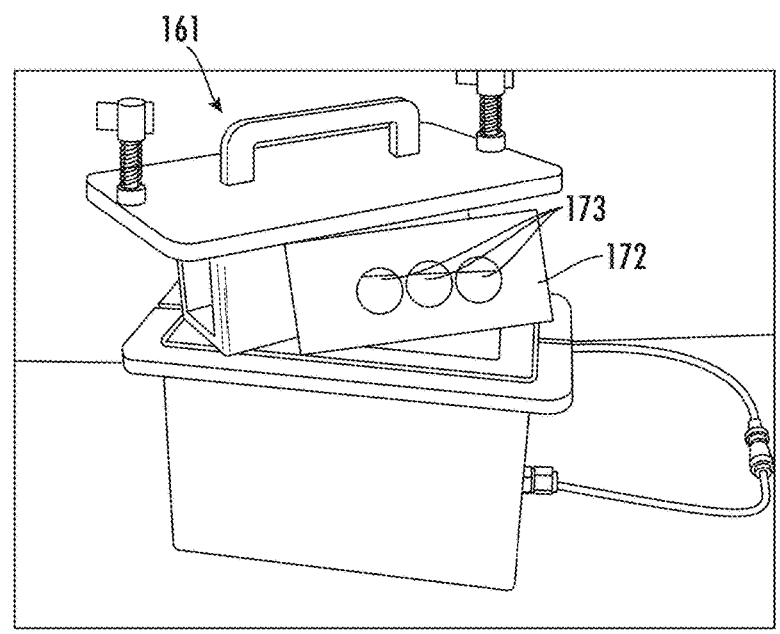
FIG. 7 illustrates one embodiment of a particle collection unit as may be utilized in a particulate formation system.

FIG. 7 illustrates one embodiment of a collection unit 161 as may be utilized in a system. As with the collection unit 160 of FIG. 6, collection unit 161 can be downstream of other components of a system (an aerosol generator, in-line diagnostics, etc.) and in fluid communication therewith via tubing. In this embodiment, a collection unit 161 can retain one or more holding plates 172, and the particulate can be deposited on a surface of a solid collector 173; for instance, in formation of a microanalytical test specimen.

In some embodiments, a particulate can be passively deposited on the surface of a solid collector 173, in which case the holding plate 172 with individual solid collectors 173 can be simply located in a collection unit 161 and particles fed to the unit can spontaneously deposit on a surface of the solid collector 173.

In one embodiment, an active deposition method can be carried out during which particles can be actively directed to one or more targeted deposition areas of a solid surface. For instance, a holding plate 172 can include multiple different solid collectors 173 toward which particles can be directed during an active deposition. Such an embodiment can provide for the formation of a single solid surface that includes multiple separated areas containing particulate or alternatively, can provide for the formation of multiple products at a single time, each carrying particulate in a designated targeted area. Moreover, in those embodiments in which each holding plate 172 carries a separate solid collector 173, e.g., a separate planchet, it may be desirable to mask a portion of the solid collector 173, such that particles are deposited on only certain designated areas of each solid collector 173, e.g., away from the edges in a 'donut' shaped deposition pattern, or in any other desired patterned deposition.

Targeting the particles of the particulate to only certain areas of a solid surface can provide for increased ease of subsequent handling for reference material end-users who can then handle the substrate edges with reduced probability of particulate contamination. This can also provide for faster formation of a solid composite structure with large amounts of particulate in the desired locations as substantially all of the particles of the formed particulate can be deposited as desired, with little or no particles lost to random deposition in the collection unit. For instance, a composite structure can be formed in a matter of hours (e.g., about 100 hours or less) including nanogram amounts (about 1 nanogram or more) of a particulate deposited in targeted areas of a solid surface.

Figure 8:
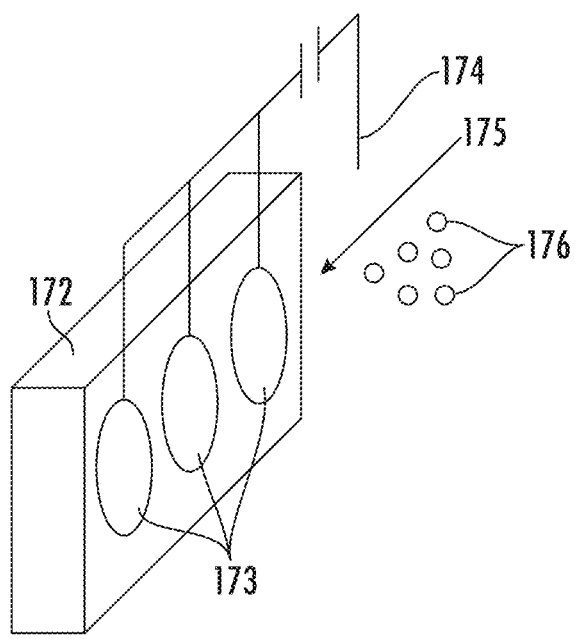
FIG. 8 illustrates one embodiment of an electrostatic precipitation method.

In one embodiment, an active particulate deposition method can include electrostatic precipitation of a particulate to a solid surface, one embodiment of which is illustrated in FIG. 8. According to this method, the solid collectors 173 that are targeted for particle deposition can include a material that exhibits low electrical resistance. For instance, solid collectors 173 can be formed of or include a high purity silicon or a graphitic material that exhibits a low electrical resistance. Such substrate materials may be desirable in some embodiments in formation of microanalytical test specimens. Other low electrical resistance materials as are known in the art may alternatively be utilized, however, and the methods are not limited to any particular low electrical resistance materials. A collection unit can also include an electrode 174 that is in electrical connection with the solid collectors 173 of the holding plate 172. During formation, an aerosol carrying a plurality of particles 176 can flow past the electrode 174 and the solid collectors 173, as indicated by the directional arrow 175.

Upon establishment of a voltage potential (e.g., of about 10-KV) between the electrode 174 and the solid collectors 173, an electric field, e.g., a corona discharge can be formed that can ionize the air around the electrode 174, which then ionizes the particles 176 of the aerosol. Due to the electrostatic force thus established, the ionized particles 176 can then be diverted toward the solid collectors 173.

The solid collectors 173 and/or the holding plate 172 that carries the solid collectors 173 can include other areas, markings, etc. as would be useful for a desired application. For instance, a solid collector 173 or masked areas of a solid collector 173 can include fiducial markings for subsequent use as microanalytical test specimens.

The present disclosure may be better understood with reference to the Examples set forth below.

Example 1

Uranium particulates were formed using a system similar to that as schematically illustrated in FIG. 6, but using solid collectors as illustrated in FIG. 8.

The feedstock included 0.08 grams of uranyl oxalate trihydrate (IBI Labs) dissolved in about 20 mL of water and heated to 70° C. as necessary to aid dissolution (0.01 mol/L uranyl oxalate). Upon complete dissolution, the solution was cooled. 8 mL of uranyl oxalate solution was drawn into a syringe for particle production. Other tested uranium-containing feedstocks included uranyl nitrate and uranyl acetate, prepared in similar fashion.

Particles were generated by an ultrasonic orifice within a flow focusing monodisperse aerosol generator (FMAG) from TSI Inc., Model 1520, operating at 0 to 250 kHz. The solution was provided to the system by syringe pump at 0.05 to 0.07 mL/min. Particles were produced for a continuous period of at least 20 minutes and fed into the collection chamber. Particles were collected on carbon or silicon wafers either actively, passively, or both. For collection, the particles were fed into a sealed box/rad bag, and were allowed to circulate as more particles were fed into the box. The active collection process used the electrostatic precipitator which pulled air and particles in and due to the wire charging the particles, deposited the particles on the planchet surface. Passive collection allowed the particles to fall onto the substrates as they circled in the box.

The active collection process collected particles on the wafers in an electrostatic precipitator with a 3-30 L/min flow rate for 5 seconds, 10 seconds, 15 seconds, 30 seconds, 1 minute, 5 minutes, or 10 minutes, and a field strength of 583 kV/m. Particles were collected passively onto carbon or silicon substrates simply laid out in the collection chamber.

Variations in process conditions were utilized to target production of particles having an average size of either 1 µm, 2 µm, or 5 µm. Conditions for each size are described in Table 1, below.

TABLE 1

| Average Particle Size | 1 µm | 2 µm | 5 µm |
| --- | --- | --- | --- |
| Frequency | 130 | 100 | 90 |
| Pump Speed (mL/h) | 2 | 4 | 4 |
| Inlet Air (psi) | 13-14 | 13-14 | 13-14 |
| Dilution Air (L/min) | 14.5-15.5 | 11.5-12.5 | 14 |
| Focusing Air (psi) | 2.0 | 1.85-1.88 | 1.50-1.55 |
| Syringe (mL) | 10-12 | 10-12 | 10-12 |
| Syringe Filter | No | No | No |
| House Nitrogen | Yes | Yes | Yes |
| Temperature (° C.) | 21-23 | 21-23 | 21-23 |
| Relative Humidity Hood (%) | 59 | 59 | 59 |
| Relative Humidity Containment Box (%) | 26-30 | 26-30 | 26-30 |

Figure 9:
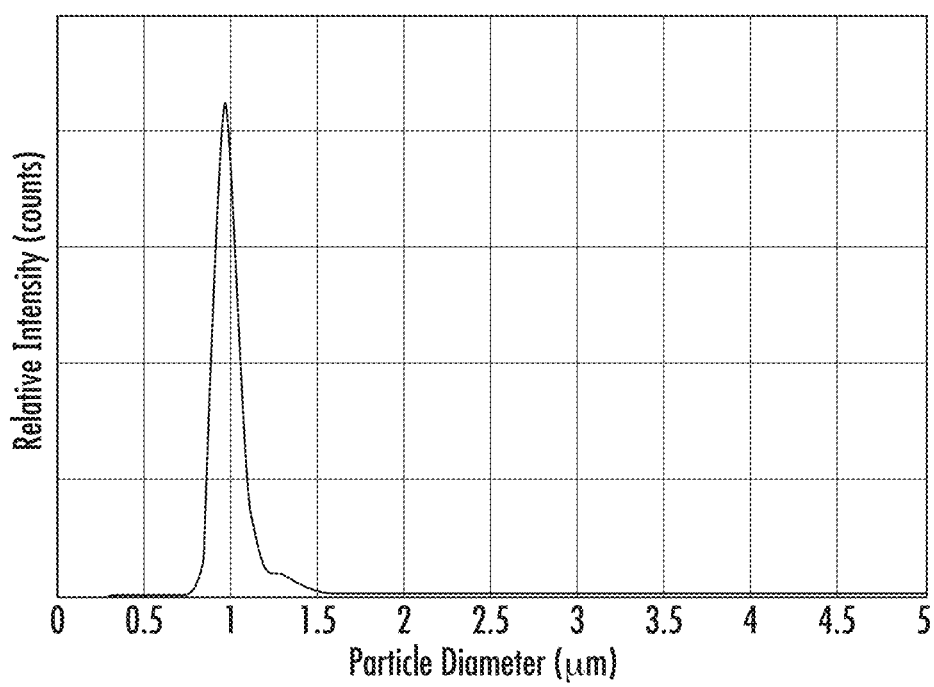
FIG. 9 illustrates a particle size distribution of 1 μm particles.
Figure 10:
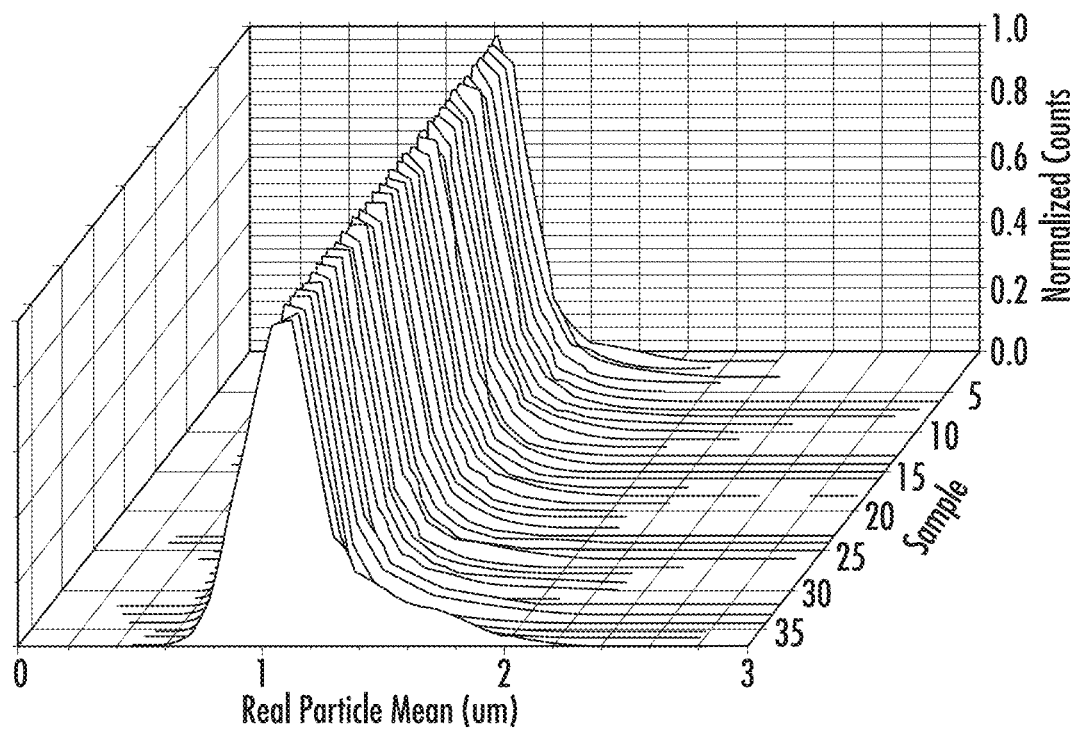
FIG. 10 illustrates particle size distributions of 1 μm particles for multiple different samples.
Figure 11:
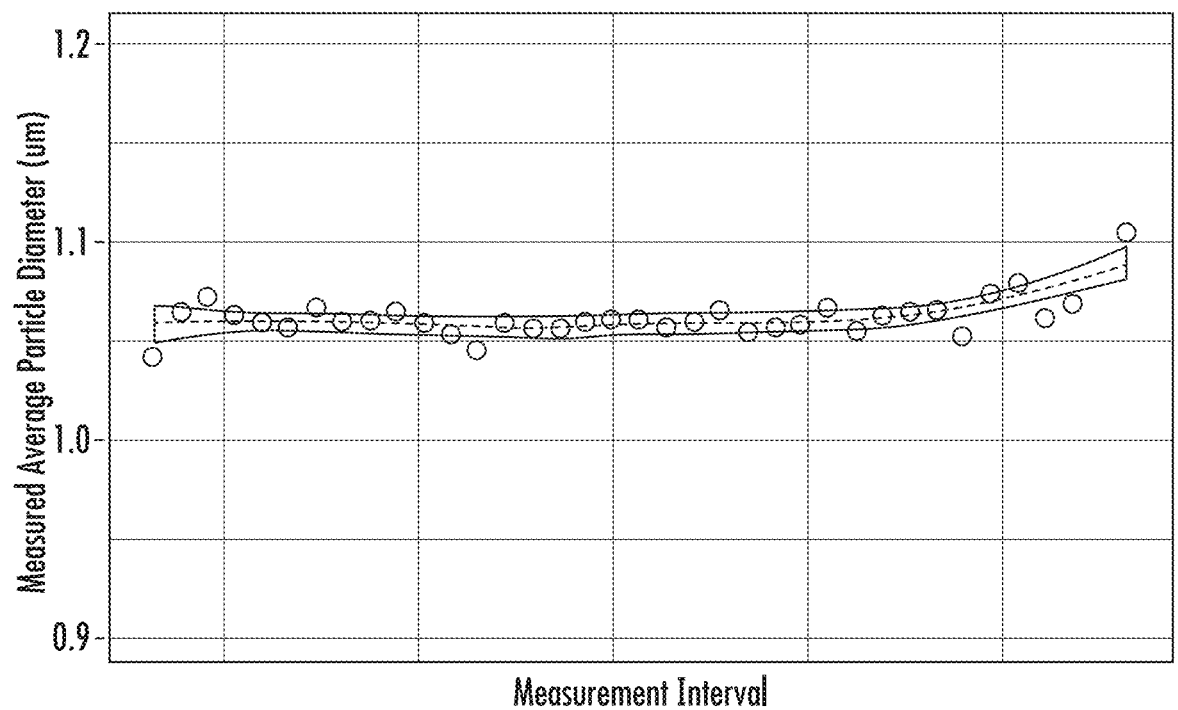
FIG. 11 illustrates a change in particle size over time over the course of a formation process.

FIG. 9 graphically illustrates the particle diameter for 1 µm particles as determined by the in-line particle size spectrophotometer. The average particle size diameter was determined to be 1.04 µm, with a geometric standard deviation of 1.17. FIG. 10 graphically illustrates the normalized results for multiple sample runs. FIG. 11 illustrates the measured average particle diameter for a typical run over the course of the formation process. After continuous operation for 6 hours, an average of $6.4 \times 10^7$ particles was generated with a mass of 0.1 milligram.

Figure 12:
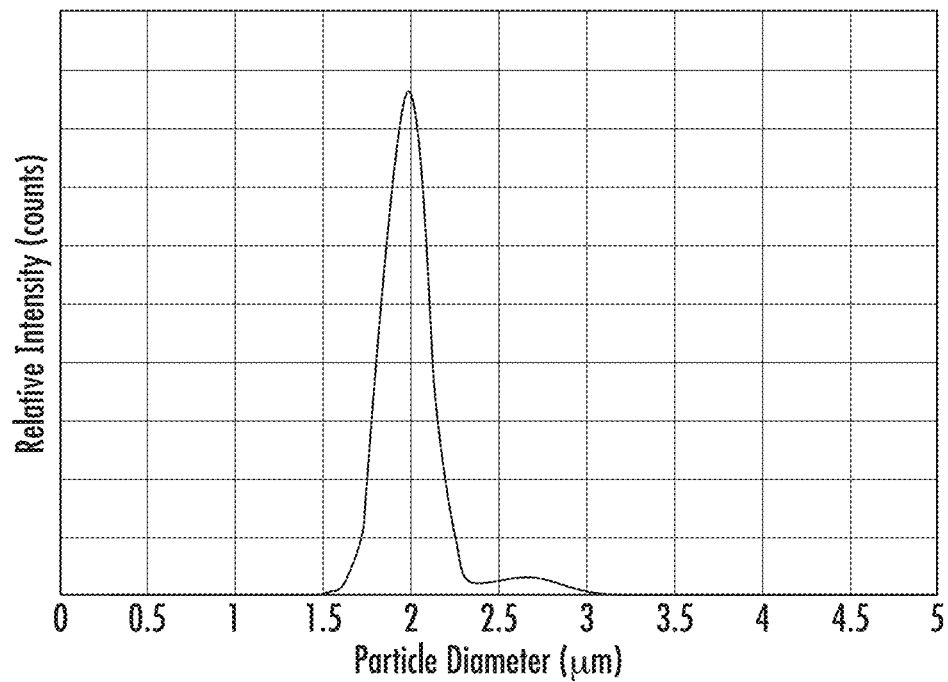
FIG. 12 illustrates a particle size distribution of 2 μm particles.
Figure 13:
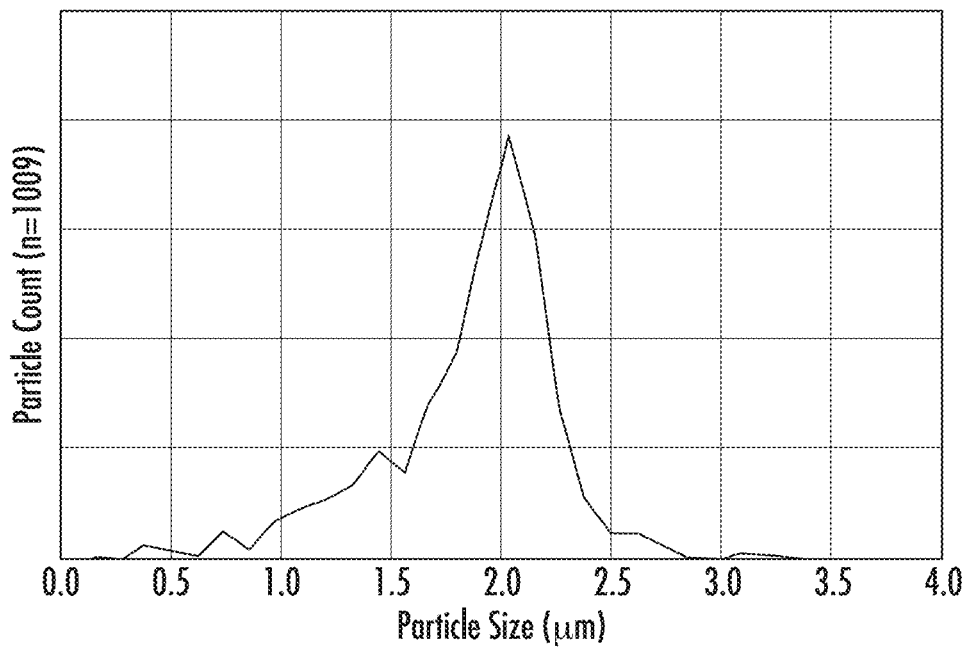
FIG. 13 illustrates another particle size distribution of 2 μm particles.
Figure 14:
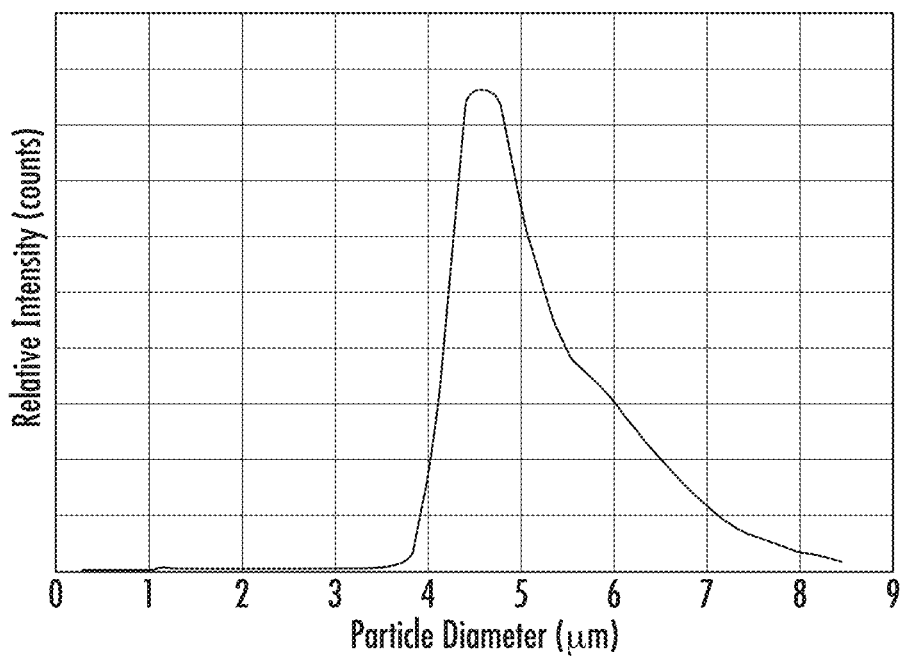
FIG. 14 illustrates a particle size distribution of 5 μm particles.

FIG. 12 graphically illustrates the particle diameter for 2 µm particles as determined by the in-line particle size spectrophotometer, and FIG. 13 presents the same information by particle count of a representative sample. FIG. 14 graphically illustrates the particle diameter for 5 µm particles as determined by the in-line particle size spectrophotometer. As can be seen, the formation process provides for formation of a particulate with a narrow size distribution.

Figure 15:
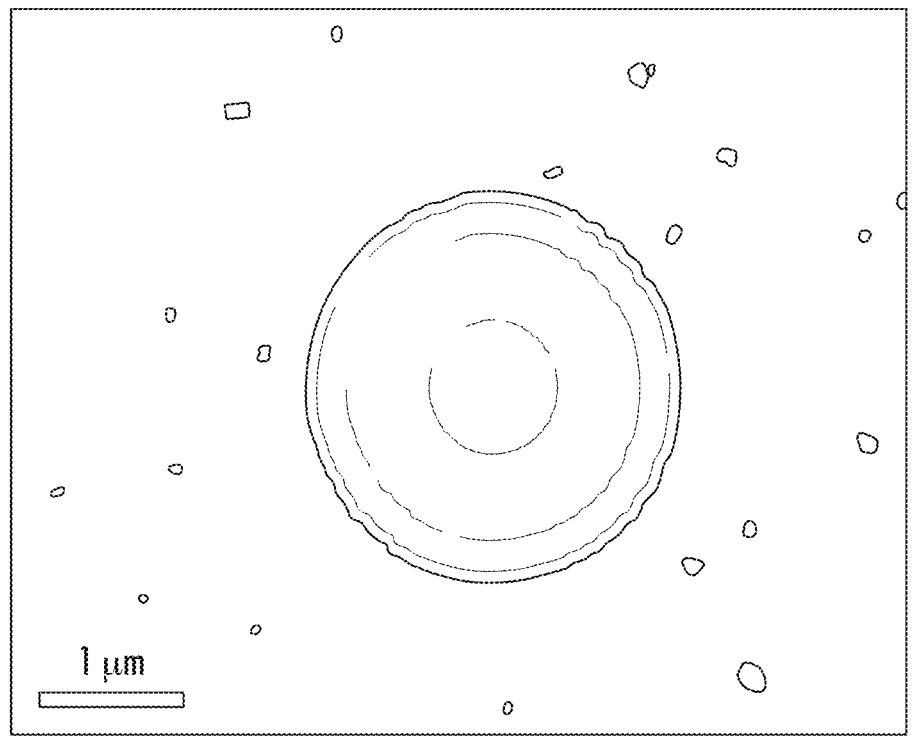
FIG. 15 provides a scanning electron microscope (SEM) image of a particle formed as described herein.
Figure 16:
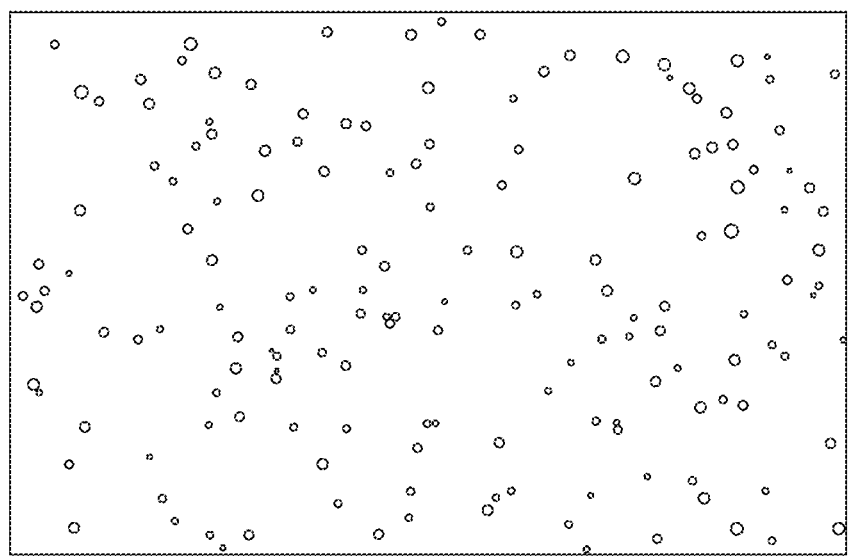
FIG. 16 illustrates a plurality of particles formed as described herein.
Figure 17:
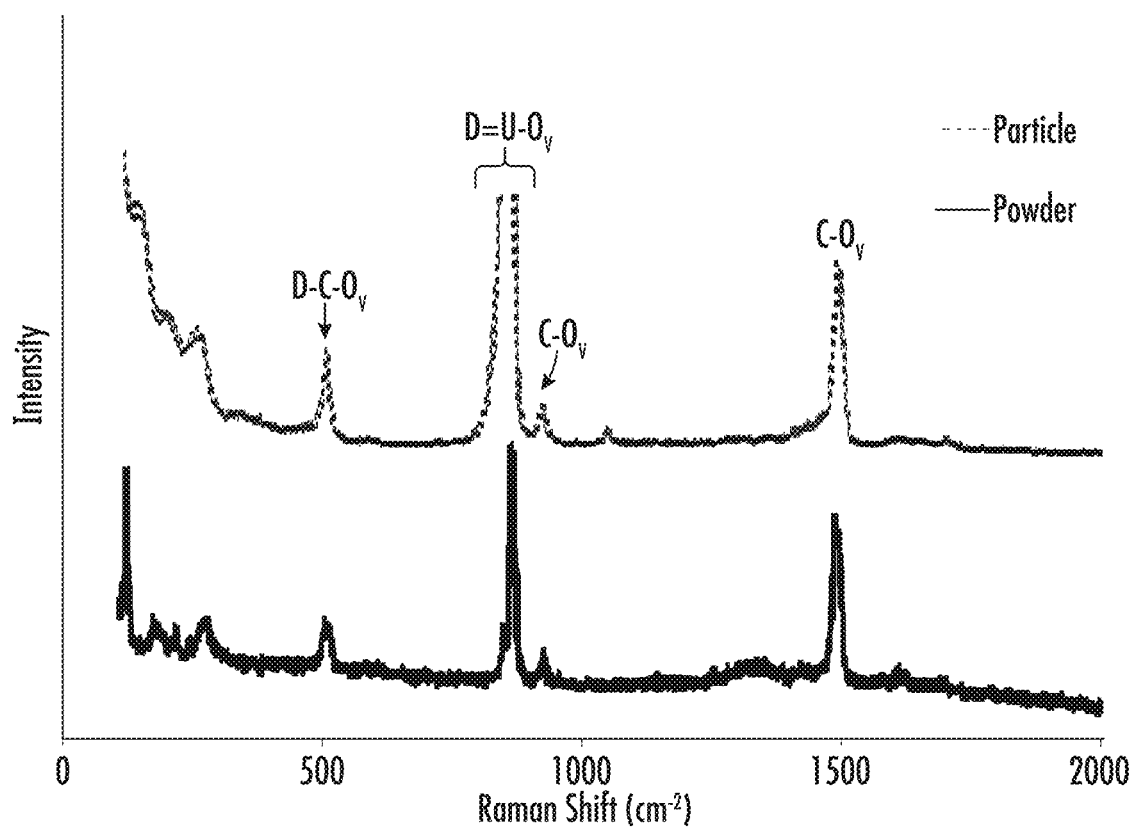
FIG. 17 presents Raman spectroscopy characterizations of a single particle (top) and a powder (bottom) comprising a plurality of particles formed as described herein.

FIG. 15 is an SEM image of a representative 1 µm particle formed according to the method and FIG. 16 illustrates the surface of a collection wafer following active collection of a plurality of particles. FIG. 17 presents Raman spectral data from a single particle (top) and a uranium oxide powder. As shown, the particle had a clear $UO_2$ peak.

Figure 18:
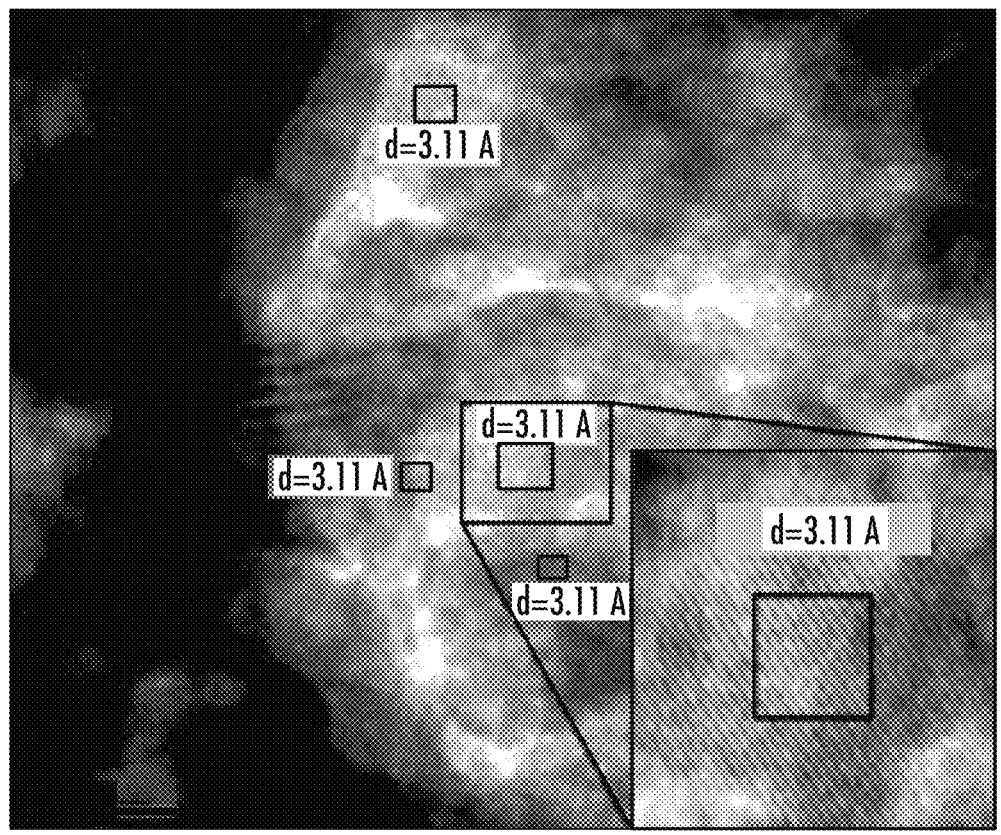
FIG. 18 presents a transmission electron microscope (TEM) image of a particle.

A TEM of a typical particle (FIG. 18) indicated d spacing of 3.11 Angstroms. For the chemical species $UO_2(C_2O_4) \cdot x H_2O$, known reference materials are as follows: 3.18 Å (112,141) trihydrate, 3.11 (–103) anhydrous, 3.10 (023) monohydrate; indicating that the particles include anhydrous $UO_2$.

Example 2

Mixed metallic element particles were formed including uranium/cerium combinations. A cerium oxalate solution was formed by dissolving 0.022 grams of Ce(III) oxalate hydrate (VWR) in 10 mL water. 2 mL concentrated nitric acid was added to aid dissolution (0.003 mol/L $HNO_3$ solution). Various amounts of the cerium oxalate solution were combined with 0.08 grams of uranyl oxalate trihydrate and 20 mL of water to form various Ce:U molar ratio solutions as follows:

| | |
| --- | --- |
| 10:1-6.67 mL | Ce solution |
| 100:1-666.67 µL | Ce solution |
| 500:1-133.33 µL | Ce solution |
| 1000:1-66.67 µL | Ce solution |

The particles were generated by use of an ultrasonic horn available from Sono-Tek Corporation operating at 180 kHz and at a power of 1 W. The aerodynamic particle sizer was a particle size spectrophotometer available from TSI Inc. Aerodynamic Particle Sizer® 3321 (APS™). The solution was provided by syringe pump at 0.125 mL/min, the air flow was 3.95 L/min. Particles were produced for 20 minutes into the collection chamber with HEPA filters. Particles were collected on 8 substrates, 6 via active electrostatic precipitator and 2 via passive collection. The six substrates used in the active collection protocols were 3 carbon and 3 silicon planchets in an electrostatic precipitator with a 3 L/min flow rate for 30 seconds. Passive collection included 60-minute collection period onto filter paper.

Figure 19:
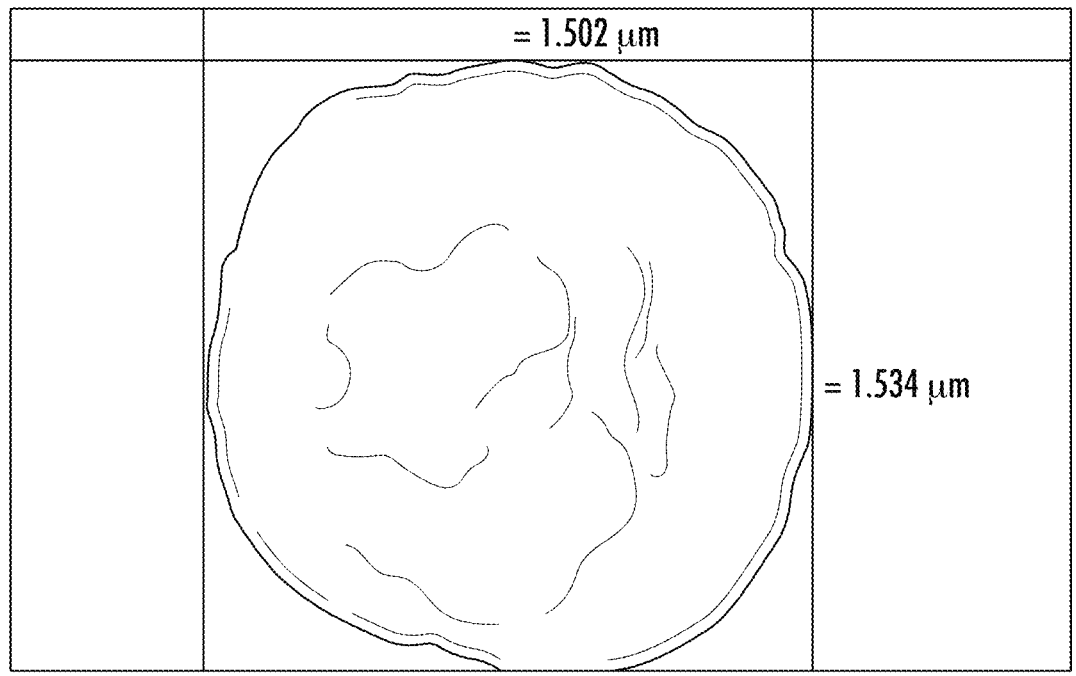
FIG. 19 presents an SEM image of a cerium/uranium multi-component particle.
Figure 20:
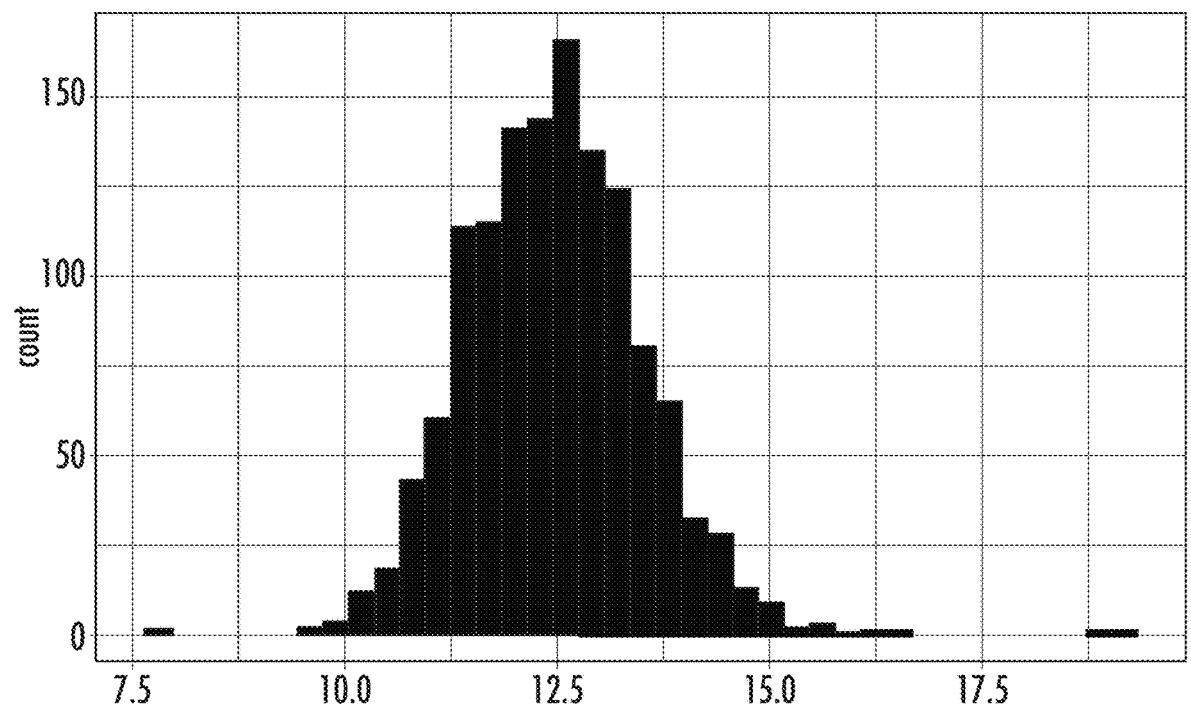
FIG. 20 presents a cerium concentration distribution for a particulate comprising multi-component cerium/uranium particles.

FIG. 19 is an image of a U/Ce particle formed at the 10:1 ratio. FIG. 20 provides the average Ce wt. % by particle. The results showed that the particles formed at the 10:1 ratio had a mean Ce content of 12.5 wt. %, with a standard deviation of 1 wt. %.

Figure 21:
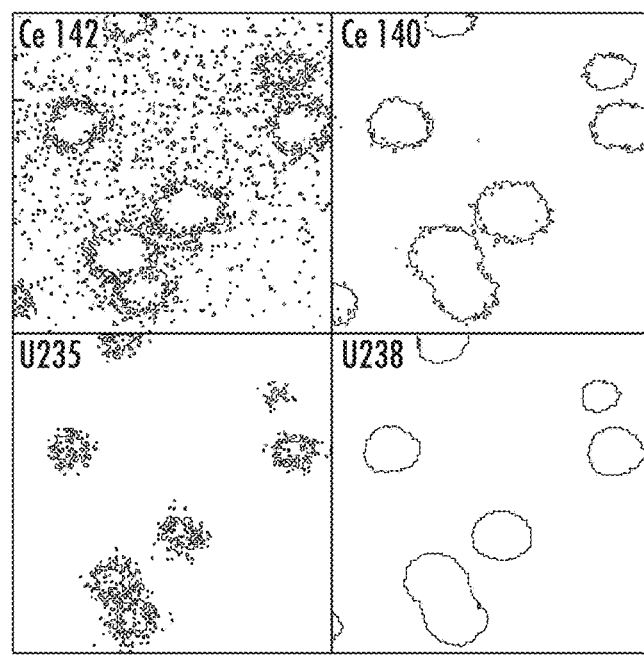
FIG. 21 presents images of different isotopes of cerium and uranium contained in a cerium/uranium particulate.

FIG. 21 provides secondary ion mass spectrometry (SIMS) images for various isotopes of cerium and uranium of the particles. As can be seen, the cerium was primarily Ce 140, with smaller amounts of Ce 142 and the uranium was primarily U 238 with smaller amounts of U 235.

Figure 22:
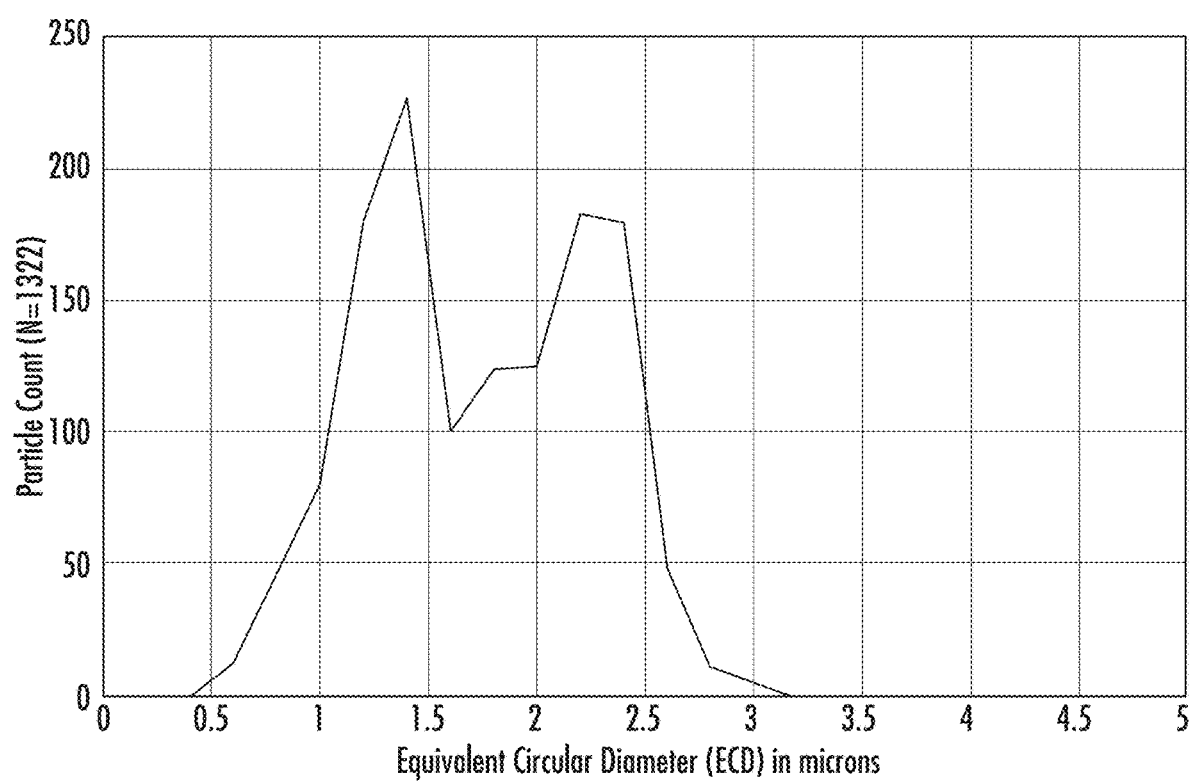
FIG. 22 presents a particle size distribution for multi-component particles formed as described herein.

FIG. 22 presents the particle size distribution by particle count for U/Ce (10/1) particles. As can be seen, in this sample, a bimodal distribution of particle sizes was obtained, with center values at approximately 1.4 µm and 2.3 µm.

While certain embodiments of the disclosed subject matter have been described using specific terms, such description is for illustrative purposes only, and it is to be understood that changes and variations may be made without departing from the spirit or scope of the subject matter.

What is claimed is:

1. A method for forming a composite structure that includes a substrate and a particulate deposited on a surface of the substrate, the method comprising:
   forming a solution comprising an oxalate salt of a metallic element;
   forming an aerosol comprising the solution, the aerosol comprising particles including the metallic element;
   directing the aerosol through an electric field, and thereby ionizing the particles of the aerosol;

following, directing the aerosol past a conductive surface of a substrate, the ionized particles of the aerosol depositing on the conductive surface as the aerosol passes the surface; wherein the deposited particles have an average particle size of about 20 micrometers or less and a geometric standard deviation of about 1.25 or less.

2. The method of claim 1, the solution comprising an oxalate salt of two or more actinides and/or lanthanides.

3. The method of claim 1, the metallic element comprising an actinide and/or a lanthanide.

4. The method of claim 1, the metallic element comprising uranium.

5. The method of claim 1, the method further comprising carrying out an in-line diagnostic procedure on the aerosol prior to directing the aerosol past the conductive surface.

6. The method of claim 5, the in-line diagnostic procedure comprising aerodynamic particle sizing.

7. The method of claim 1, where the conductive surface comprises a doped silicon or a graphite.

8. The method of claim 1, the ionized particles depositing on multiple conductive surfaces simultaneously.

9. The method of claim 1, the solution comprising multiple metallic elements.

10. The method of claim 9, the solution comprising a first metallic element and a second metallic element at a molar ratio of the first metallic element to the second metallic element of from 10:1 to 1000:1.

11. The method of claim 1, the solution comprising the metallic element with a known isotopic content.

12. The method of claim 1, wherein the particles are deposited at a rate of 0.01 milligram particles per hour or greater.

13. The method of claim 1, the method forming from about 0.5 milligrams to about 2 milligrams of particles in a period of from about 50 hours to about 100 hours.

14. The method of claim 1, the deposited particles having an average diameter maxima of about 5 micrometers or less.

15. The method of claim 14, the deposited particles having a geometric standard deviation of about 1.2 or less.

16. The method of claim 1, wherein the aerosol is formed by use of a flow-focusing monodisperse aerosol generator.

17. The method of claim 1, wherein the aerosol is formed according to a method that includes injecting the solution into an airflow at an injection rate of 0.05 to 0.07 milliliters per minute.

18. The method of claim 17, wherein the airflow is at a rate of 3 to 30 liters per minute.

* * * * *